(12) United States Patent
Knoedgen

(10) Patent No.: US 6,969,652 B2
(45) Date of Patent: Nov. 29, 2005

(54) NATURAL ANALOG OR MULTILEVEL TRANSISTOR DRAM-CELL

(75) Inventor: Horst Knoedgen, Munich (DE)

(73) Assignee: Dialog Semiconductor GmbH, Kirckheim/Teck-Nabern (DE)

(*) Notice: Subject to any disclaimer, the term of this patent is extended or adjusted under 35 U.S.C. 154(b) by 0 days.

(21) Appl. No.: 10/615,124

(22) Filed: Jul. 8, 2003

(65) Prior Publication Data

US 2005/0018501 A1 Jan. 27, 2005

(30) Foreign Application Priority Data

Jun. 27, 2003 (EP) ................................ 033920075

(51) Int. Cl.$^7$ .......................................... H01L 21/336
(52) U.S. Cl. .................................... 438/258; 438/289
(58) Field of Search ............................. 438/258, 289, 438/241; 365/149

(56) References Cited

U.S. PATENT DOCUMENTS

| | | | |
|---|---|---|---|
| 3,760,380 A | 9/1973 | Hoffman et al. ........ 340/173 R |
| 4,335,450 A | 6/1982 | Thomas ...................... 365/182 |
| 4,577,390 A * | 3/1986 | Haken ........................ 438/396 |
| 4,694,341 A | 9/1987 | Soneda et al. .............. 358/160 |
| 5,500,522 A | 3/1996 | Eshraghian et al. ..... 250/208.1 |
| 5,805,021 A * | 9/1998 | Brehmer ..................... 330/253 |
| 5,923,975 A * | 7/1999 | Rolandi ...................... 438/258 |
| 6,282,115 B1 | 8/2001 | Furukawa et al. .......... 365/149 |
| 6,373,767 B1 | 4/2002 | Patti ........................... 365/210 |
| 2002/0167845 A1 | 11/2002 | Jain ............................ 365/187 |
| 2003/0090948 A1 | 5/2003 | Kanno et al. ............... 365/200 |

FOREIGN PATENT DOCUMENTS

| | | | | |
|---|---|---|---|---|
| EP | 442335 A1 | 8/1991 | ........... G11C 16/04 |
| WO | WO 86/07488 | 12/1986 | ........... G11C 27/02 |

* cited by examiner

Primary Examiner—David Nelms
Assistant Examiner—Quoc Hoang
(74) Attorney, Agent, or Firm—George O. Saile; Stephen B. Ackerman

(57) ABSTRACT

Circuits and methods to design and to fabricate said circuits to accomplish a two-level DRAM cell or a multilevel DRAM cell using a natural transistor have been achieved. The usage of a natural transistor, having a threshold voltage of close to zero, as a pass transistor reduces the amount of current required for a read operation significantly. The usage of a natural transistor in a multi-level DRAM is enabling to implement easily a high number of voltage levels, and thus more information, in one DRAM cell and is reducing the amount of output current required as well. The fabrication of said DRAM cells in an integrated circuit, comprising a natural transistor and standard transistors, include masking of the natural transistor during the ion implantation to avoid impurities increasing the threshold voltage.

8 Claims, 2 Drawing Sheets

---

*Start*

| Mask the channel of the natural transistor to avoid any impurities caused by the following ion implant stop | — 51 |

↓

| Perform ion implant to define threshold voltage of the standard transistors | — 52 |

↓

| Remove mask from natural transistor and continue standard processes | — 53 |

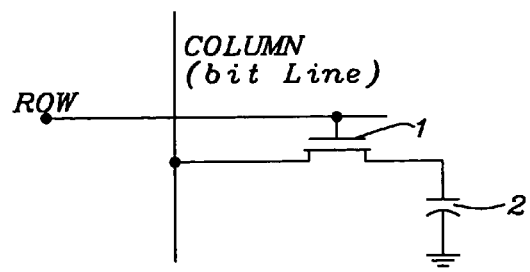
FIG. 1 – Prior Art
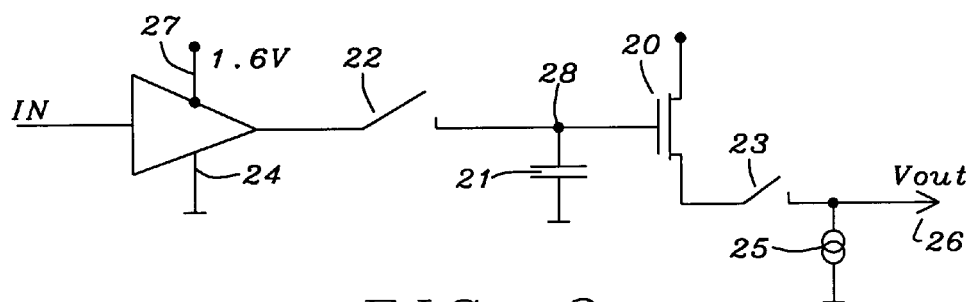
FIG. 2
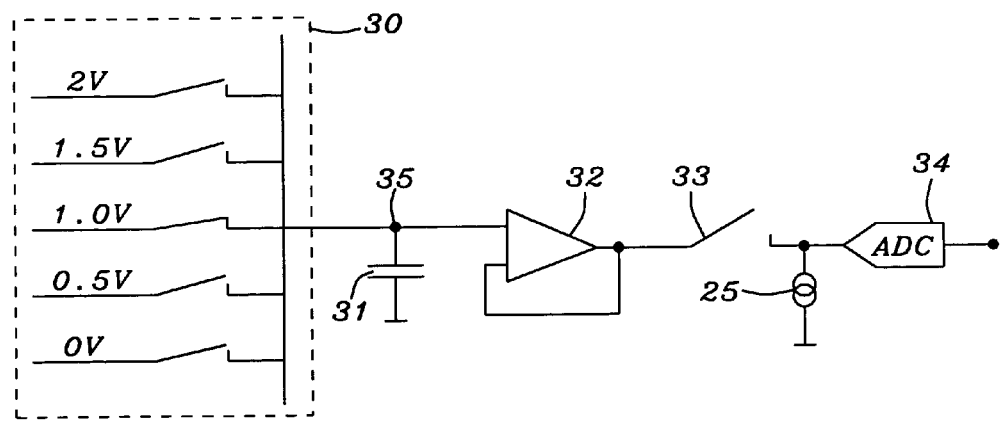
FIG. 3

Start

| Deploy a capacitor as DRAM storage element | — 41 |

↓

| Deploy a transistor, having a minimal threshold voltage, to sense the charge of said storage capacitor. Said charge represents a value of stored information | — 42 |

*FIG. 4*

Start

| Mask the channel of the natural transistor to avoid any impurities caused by the following ion implant stop | — 51 |

↓

| Perform ion implant to define threshold voltage of the standard transistors | — 52 |

↓

| Remove mask from natural transistor and continue standard processes | — 53 |

*FIG. 5*

NATURAL ANALOG OR MULTILEVEL TRANSISTOR DRAM-CELL

BACKGROUND OF THE INVENTION (1) Field of the Invention

The present invention relates generally to semiconductor storage cells, and more particularly, to dynamic analog or multilevel RAM (DRAM) cells using a natural transistor.

(2) Description of the Prior Art

Dynamic RAM (DRAM) is a type of RAM that only holds its data if it is continuously accessed by a special logic called a refresh circuit. Many hundreds of times each second, this circuitry reads and then re-writes the contents of each memory cell, whether the memory cell is being used at that time by a processor or not. If this is not done, then the DRAM will lose its content, even if it continues to have power supplied to it. This refreshing action is why the memory is called dynamic.

Dynamic memory cells store a data bit in a small capacitor. The advantage of this type of cell is that it is very simple, thus allowing very large memory arrays to be constructed on a chip at low cost. FIG. 1 prior art shows principally a dynamic RAM (DRAM) cell capable of storing a single bit of information. Said memory cell is consisting of a single MOS transistor 1 and a capacitor 2.

In this type of cell, the transistor acts as a switch, allowing the capacitor to be charged or discharged or, in other words, to store a "1" or a "0".

A challenge to the designers of DRAM cells is power consumption and the ability to store not just two levels ("0" or "1") but also more levels of information in one DRAM cell.

There are various patents available dealing with said problems:

U.S. Pat. No. 6,373,767 to Patti describes a multi-level memory in which each storage cell stores multiple bits. The memory includes a plurality of storage words, a data line, a plurality of reference lines, and a read circuit. Each storage word includes a data memory cell and a plurality of reference memory cells. A stored charge determines a conductivity value measurable between the first and second terminals of each memory cell. The read circuit generates a digital value indicative of the value stored in the data memory cell of a storage word that is connected to the data and reference lines by comparing the conductivity of the data line with a continuous conductivity curve determined by the conductivities of the reference lines.

U.S. Pat. No. 6,282,115 to Furukawa et al. discloses a multi-level memory cell capable of storing two or three bits of digital data occupying only four lithographic squares and requiring only one or two logic level voltage sources, respectively. High noise immunity derives from integration of the multi-level signal in the memory cell directly from logic level digital signals applied to two capacitors (as well as the bit line for the eight level mode of operation) by using capacitors having different values in order to avoid digital-to-analog conversion during writing. The capacitors can be simultaneously written and read to reduce memory cycle time. Transistor channels and capacitor connections are formed on adjacent semiconductor pillars using plugs of semiconductor material between pillars as common gate structures and connections. Opposite surfaces of the pillars also serve as storage nodes with common capacitor plates formed by conformal deposition between rows of plugs and pillars.

U.S. Pat. No. 4,335,450 to Thomas describes a non-destructive read out memory cell system having a semiconductor substrate supporting an array of memory cells each of which includes a field effect transistor having a source and a drain defining a channel region having high and low threshold sections. In a first embodiment the channel region is further defined by the upper surface of the semiconductor substrate, and in second and third embodiments the channel region is further defined by a V-groove and by a U-groove, respectively, formed in the substrate. A gate electrode separated from the surface of the semiconductor substrate by a thin insulating layer is disposed over the channel region. A storage node, preferably an N+ diffusion region, is located within the substrate adjacent to the high threshold section of the channel region. Pulsing means are provided for selectively charging and discharging the storage node and sensing means are provided to determine the flow of current passing through the channel region, which is representative of the binary information contained on the storage node. Since the memory cells of the system of the present invention are current sensitive and since these cells hold charge for a relatively long period of time compared with conventional dynamic device memory cells, the system may be used for multilevel storage.

SUMMARY OF THE INVENTION

A principal object of the present invention is to provide a circuit for a two-level DRAM cell requiring a reduced output current.

A further object of the present invention is to achieve a circuit enabling a high number of different levels in a multi-level DRAM cell.

Another further object of the present invention is to achieve a circuit for a multi-level DRAM cell requiring a reduced output current.

Another further object of the invention is to achieve a method how to design a circuit for a DRAM cell requiring a reduced output current.

Another further object of the invention is to achieve a method how to fabricate a circuit for a DRAM cell requiring a reduced output current.

In accordance with the objects of this invention a circuit to achieve a DRAM cell requiring a reduced output current has been accomplished. Said circuit comprises a switch to activate a write operation to said DRAM cell, a storage capacitor, a pass transistor to support a read operation out of said DRAM cell being a natural transistor, a switch to activate a read operation out of said DRAM cell, and a current source to support the read operation out of said DRAM cell.

In accordance with further objects of the invention a circuit of a multi-level DRAM cell requiring a reduced output current has been achieved. Said circuit comprises a storage capacitor, a multiplexer having multiple switches to activate a write operation for a specific voltage level to said storage capacitor, a pass amplifier to support a read operation out of said storage capacitor comprising a natural transistor, a current source to support the read operation out of said DRAM cell, a switch to activate a read operation out of said storage capacitor, and an analog-to-digital converter (ADC) to convert the analog values of said read operation into digital values.

In accordance with further objects of the invention a method to achieve a two-level DRAM cell requiring a reduced output current has been achieved. Said method comprises, first, providing a capacitor, a transistor as pass transistor, and peripheral circuitry to activate and to drive said DRAM cell comprising switches, a current source and an amplifier. The steps of said method are to deploy said capacitor as DRAM storage element, and to deploy a transistor, having a minimal threshold voltage, as pass transistor to sense the charge of said storage capacitor, wherein said charge represents a value of stored information.

In accordance with further objects of the invention a method to achieve a multi-level DRAM cell requiring a reduced output current has been achieved. Said method comprises, first, providing a capacitor, a transistor as pass transistor, and peripheral circuitry to activate and to drive said DRAM cell comprising a multiplexer containing switches to activate a desired voltage level, a switch to activate a read-out of said DRAM cell, an analog-to-digital converter, a current source and an amplifier. The steps of said method are to deploy said capacitor as DRAM storage element, and to deploy a transistor, having a minimal threshold voltage, as pass transistor to sense the charge of said storage capacitor, wherein said charge represents a value of stored information.

In accordance with further objects of the invention a method to fabricate a two-level DRAM cell requiring a reduced output current has been achieved. Said method comprises, first, providing a capacitor, a natural transistor as pass transistor, and peripheral circuitry to activate and to drive said DRAM cell comprising standard transistors, a current source, and an amplifier. The steps of said method are to mask the channel of the natural transistor to avoid any impurities caused by the following ion implant step, to perform ion implant to define threshold voltage of the standard transistors as part of the DRAM cell, and to remove said mask from natural transistor and continue standard processes.

In accordance with further objects of the invention a method to fabricate a multi-level DRAM cell requiring a reduced output current has been achieved. Said method comprises, first, providing a capacitor, a natural transistor as pass transistor, and peripheral circuitry to activate and to drive said DRAM cell comprising a multiplexer containing transistors to activate a desired voltage level, a transistor to activate a read-out of said DRAM cell, an analog-to digital converter, a current source, and an amplifier. The steps of said method are to mask the channel of the natural transistor to avoid any impurities caused by the following ion implant step, to perform ion implant to define threshold voltage of the standard transistors as part of the DRAM cell, and remove said mask from natural transistor and continue standard processes.

BRIEF DESCRIPTION OF THE DRAWINGS

In the accompanying drawings forming a material part of this description, there is shown:

FIG. 1 prior art shows principally the basic elements of a dynamic RAM (DRAM) cell.

FIG. 2 shows a basic schematic of a circuit of a two-level DRAM cell invented.

FIG. 3 shows a basic schematic of a circuit of a multi-level DRAM cell.

FIG. 4 shows a flowchart of a method to design a DRAM cell invented

FIG. 5 shows a flowchart of a method to fabricate a DRAM cell invented

DESCRIPTION OF THE PREFERRED EMBODIMENTS

The preferred embodiments disclose circuits and methods to achieve and to fabricate a DRAM cell storing two and more levels of voltage requiring low output currents by using a natural transistor to charge/discharge a storage capacitor.

The threshold voltage $V_{th}$ of a MOS transistor defines the voltage at which a MOS transistor begins to conduct. For voltages less than $V_{th}$, the channel is cut off. Introducing a small doped region at the oxide/substrate interface via ion implantation modifies said threshold voltage Vth.

A natural transistor has a threshold voltage $V_{th}$ of nearly zero volts and can be formed by doping no impurity for adjusting the threshold voltage $V_{th}$ in a channel. The channel impurity of a natural transistor is equal to the substrate impurity concentration. A natural transistor reduces the drain voltage without increasing production processes and cost. It is obvious that a natural transistor is opening its channel at very low voltages.

FIG. 2 shows a preferred embodiment of a circuit of a DRAM cell invented. Capacitor 21 is used as storage capacitor, storing one bit of information ("0" or "1"); pass transistor 20 is a natural transistor acting as a switch to charge/discharge said capacitor 21. In a preferred embodiment said pass transistor 20 has been built using NMOS technology. CMOS and even PMOS technology could be used to build said natural transistor.

The amplifier 24 is used for decoupling having, in a preferred embodiment, a supply voltage 27 of 1.6 volts. A constant current source 25 is providing the current for charging said storage capacitor 21 and to define the source of the N-channel transistor 20. Switches 22 and 23 are used for logic purposes to enable read/write operations and refreshing the charge capacitor 21. In a preferred embodiment standard transistors, having a threshold voltage $V_{th}$ of e.g. 0.8 volts, are being used for said switches. Port 26 signifies the output voltage of the DRAM cell invented.

In prior art a standard transistor, having a threshold voltage $V_{th}$ of typically 0.8 volts, would be used for the role of pass transistor 20. In this case, having, e.g., an input voltage 27 of 1.6 volts, the output voltage $V_{out}$ 26 amounts to 0.8 volts.

As key part of the invention a natural transistor is used for the role of pass transistor 20, having a very low threshold voltage of e.g. 0.2 volts. Thus the output voltage $V_{out}$ 26 amounts to 1.4 volts. The increased output voltage, compared to prior art, leads to the advantage of requiring much reduced output current for a read operation.

FIG. 3 shows as another embodiment of the invention the usage of a natural transistor in a multilevel DRAM cell. In a preferred embodiment five different voltage levels are used to charge a storage capacitor. The difference of said five voltage levels is 0.5 volts each. This leads to a capability of storing five different logical values in one DRAM cell in the range of zero volts to two volts. The circuit is comprising a multiplexer circuit 30 to activate one out of five voltage levels, a storage capacitor 31, a constant current source 25 is providing the current for charging said storage capacitor 31, an amplifier 32 comprising a natural transistor, a switch 33 to activate a read operation and an analog-to-digital converter 34 to convert the voltage level 35 of the storage capacitor, representing said five different logical values, into a digital value between "0" and "4". Said multiplexer 30 is comprising in a preferred embodiment five switches to activate one of five voltage levels in a write or refresh operation. In FIG. 3 the voltage level of 1.0 volt happens to be activated. Said five switches being part of the multiplexer 30 and switch 33 are standard transistors having a threshold voltage of 0.8 volts in a preferred embodiment.

It is obvious that the number of voltage levels activated in said multiplexer circuit and stored in a storage capacitor could be increased far beyond five levels as described in said preferred embodiment.

In order to get a distinct output signal the differences between the voltage levels, activated by said multiplexer, have to be greater than the threshold voltage $V_{th}$ of the transistor used in said amplifier 32. Due to the minimal threshold voltage $V_{th}$ of the natural transistor used in the amplifier 32 the differences between the voltage levels used in the multiplexer can be kept in the order of magnitude of 0.5 volts or even smaller. The smaller the differences of said voltage levels are the more voltage levels or in other words, more information, can be stored in the storage capacitor of the DRAM cell invented.

FIG. 4 describes a method how to achieve a DRAM cell storing two and more levels of voltage requiring low output currents by using a natural transistor to charge/discharge a storage capacitor. The first step 41 shows that a capacitor is deployed as DRAM storage element. Said capacitor could store two or more levels of voltage depending on if a two-level RAM cell or multi-level DRAM cell is used. In the next step 42 a transistor, having a minimal threshold voltage, is deployed to sense the charge of said storage capacitor. In a preferred embodiment a natural transistor is used for this purpose.

Said charge represents a value of stored information. The minimal threshold voltage of a natural transistors enables a higher output voltage and hence a lower output current compared to standard transistors.

All modern MOS technologies involve use of ion implantation to adjust the threshold voltage of MOS transistors. The key process control parameters for threshold adjustment are the implant dose and energy for a given oxide thickness. The DRAM circuits described above comprise a natural transistor, receiving no ion implant at all to achieve a threshold voltage of e.g. 0.2 volts and lower, and standard transistors wherein a threshold voltage of e.g. 0.8 volts is achieved by a standard ion implant process.

FIG. 5 describes a flowchart of a method to fabricate a natural transistor in an integrated circuit of a DRAM cell described above comprising further standard transistors along with said natural transistor. Only the specific steps of defining the threshold voltage of said standard transistors and avoiding the doping of the natural transistor are shown in said flowchart. The remaining steps of fabricating said IC follow the well-known processes. Step 51 shows that the channel of the natural transistor has to be masked prior to the ion implantation of the standard transistors required to define the threshold voltage of said standard transistors in step 52. Thus any ion implant into the natural transistor is avoided and subsequently the threshold voltage of the natural transistor is kept very low, e.g. 0.2 volts. After the ion implant process the mask over the natural transistor is removed in step 53 and the remaining well known standard processes to fabricate an MOS IC are performed.

While the invention has been particularly shown and described with reference to the preferred embodiments thereof, it will be understood by those skilled in the art that various changes in form and details may be made without departing from the spirit and scope of the invention.

What is claimed is:

1. A method to fabricate a two-level DRAM cell requiring a reduced output current, comprising:
    providing a capacitor, a natural transistor as pass transistor, and peripheral circuitry to activate and to drive said DRAM cell comprising standard transistors, a current source and an amplifier;
    mask the channel of the natural transistor to avoid any impurities caused by a following ion implant step;
    perform ion implant to define threshold voltage of the standard transistors as part of the DRAM cell; and
    remove mask from natural transistor and continue standard processes.

2. The method of claim 1 wherein said natural transistor is a PMOS transistor.

3. The method of claim 1 wherein said natural transistor is a CMOS transistor.

4. The method of claim 1 wherein said natural transistor is a NMOS transistor.

5. A method to fabricate a multi-level DRAM cell requiring a reduced output current, comprising:
    providing a capacitor, a natural transistor as pass transistor, and peripheral circuitry to activate and to drive said DRAM cell comprising a multiplexer containing transistors to activate a desired voltage level, a transistor to activate a read-out of said DRAM cell, an analog-to digital converter, a current source and an amplifier;
    mask the channel of the natural transistor to avoid any impurities caused by a following ion implant step;
    perform ion implant to define threshold voltage of the standard transistors as part of the DRAM cell; and
    remove mask from natural transistor and continue standard processes.

6. The method of claim 5 wherein said natural transistor is a PMOS transistor.

7. The method of claim 5 wherein said natural transistor is a CMOS transistor.

8. The method of claim 5 wherein said natural transistor is a NMOS transistor.

* * * * *